US008568605B2

(12) United States Patent
Walavalkar et al.

(10) Patent No.: US 8,568,605 B2
(45) Date of Patent: Oct. 29, 2013

(54) FORMING NANOMETER-SIZED PATTERNS BY ELECTRON MICROSCOPY

(75) Inventors: Sameer Walavalkar, Los Angeles, CA (US); Axel Scherer, Barnard, VT (US); Andrew P. Homyk, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 76 days.

(21) Appl. No.: 13/299,332

(22) Filed: Nov. 17, 2011

(65) Prior Publication Data

US 2012/0152902 A1 Jun. 21, 2012

Related U.S. Application Data

(60) Provisional application No. 61/415,162, filed on Nov. 18, 2010.

(51) Int. Cl.
*C23F 1/00* (2006.01)
*B44C 1/22* (2006.01)

(52) U.S. Cl.
USPC ............... 216/66; 216/41; 216/56; 216/62; 216/67; 216/94; 250/492.1; 250/492.3

(58) Field of Classification Search
USPC ........... 216/41, 56, 62, 66, 67, 94; 250/492.1, 250/492.3
See application file for complete search history.

(56) References Cited

U.S. PATENT DOCUMENTS

| 5,138,169 | A | * | 8/1992 | Yamazaki et al. | ............. 250/398 |
| 6,565,764 | B2 | * | 5/2003 | Hiraoka et al. | .................. 216/56 |
| 2006/0165994 | A1 | * | 7/2006 | Dalakos et al. | ................ 428/408 |
| 2006/0231525 | A1 | * | 10/2006 | Asakawa et al. | ................ 216/56 |
| 2010/0027118 | A1 | * | 2/2010 | Rosenman et al. | ............ 359/507 |
| 2012/0037595 | A1 | * | 2/2012 | Asakawa et al. | ................ 216/41 |

OTHER PUBLICATIONS

Storm, AJ, et al., Fabrication of solid-sate nanopores with single-nanometre precision, Nature Materials 2003, 2: 537-540.

* cited by examiner

Primary Examiner — Shamim Ahmed
(74) Attorney, Agent, or Firm — Steinfl & Bruno LLP

(57) ABSTRACT

A method for forming nanometer-sized patterns and pores in a membrane is described. The method comprises incorporating a reactive material onto the membrane, the reactive material being a material capable of lowering an amount of energy required for forming a pore and/or pattern by irradiating the membrane material with an electron beam, thus leading to a faster pore and/or pattern formation.

21 Claims, 7 Drawing Sheets

FORMING NANOMETER-SIZED PATTERNS BY ELECTRON MICROSCOPY

CROSS REFERENCE TO RELATED APPLICATIONS

The present application claims priority to U.S. Provisional Application No. 61/415,162, filed on Nov. 18, 2010, which is incorporated herein by reference in its entirety.

FIELD

The present disclosure relates to methods for using electron microscopy to form pores. In particular, it relates to forming nanometer-sized patterns and pores by electron microscopy.

BACKGROUND

High-resolution electron microscopy can be used to form nanometer-sized pores in membranes [1]. Electron beam ablation or melting to form pores can use nanometer-scale beams that are focused onto a material. The material onto which the beam is focused can slowly erode and evaporate in an area of irradiation to provide a pore.

SUMMARY

According to a first aspect of the disclosure, a method for forming a nanometer-sized pattern in a membrane is described. The method comprises providing a membrane, depositing a reactive material on the membrane, the reactive material being in a solid state and comprising a substance capable of etching the membrane under a certain set of conditions, and irradiating the membrane comprising the reactive material over a certain area and for a certain period of time with an electron beam to provide a nanometer-sized pattern in the membrane.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
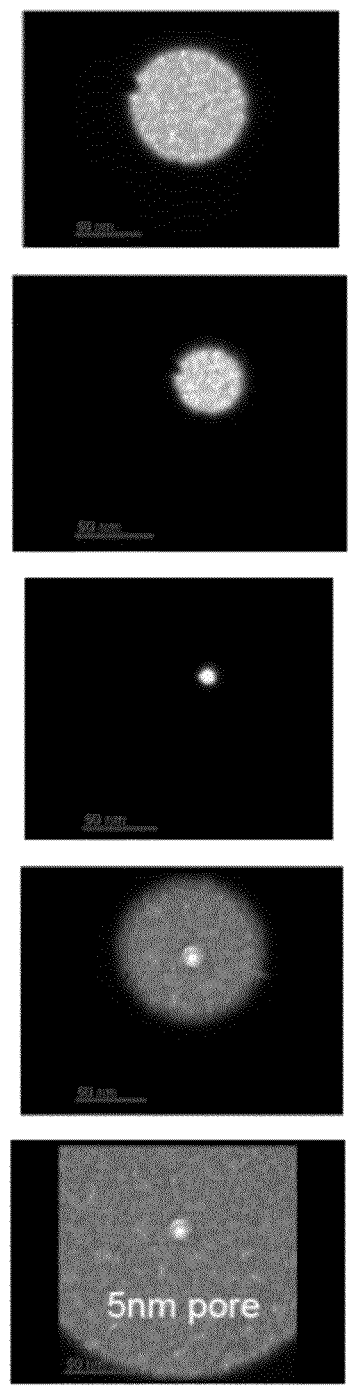
FIG. 1 shows an exemplary pore forming process within a membrane as observed within an electron microscope.

Fabrication of nanometer-sized pores can be obtained by electron beam ablation of a material. Nanometer-sized pores can be utilized in many applications where a nanoscale separation of components is desired, such as, for example, in single-molecule sequencing.

The term "electron beam ablation" as used herein is defined to mean a removing of a material from a surface by vaporization, decomposition, and/or erosion performed by irradiation with an electron beam.

Electron beam ablation or melting to form pores can use nanometer-scale beams that are focused onto a thin membrane, for example, a membrane which is approximately 200 nm or less in thickness. The membrane onto which the beam is focused can slowly erode and evaporate in an area of irradiation. The erosion and evaporation can be done by heating and volatilization through a breaking of chemical and/or inter atomic bonds of which the membrane is comprised and a heating of a local area of the membrane such that liberated atoms can escape as gases. The method can typically utilize long exposure times since the electron beam ablation can be slow, taking approximately 30 seconds to several minutes to form a pore.

To decrease exposure time needed to form a nanometer-sized pore in a membrane, herein is described a method comprising providing a membrane and depositing a reactive material onto the membrane, thus providing a membrane comprising a reactive material, and irradiating the membrane over a pore radius and for a certain period of time to define a pore in the membrane, wherein the period of time can be approximately 1-10 milliseconds. The irradiating of the membrane over a certain radius for a certain period of time can be repeated to define additional pores over different radii and at locations on the membrane different from any previously defined pores. Additionally, more complex patterns can be formed in a membrane comprising a reactive material by irradiating the membrane by dragging an electron beam along a surface of the membrane to form the complex pattern.

The term "membrane" as used herein, is defined to mean a material which is unsupported by another material. Membranes materials can be deposited on a support, for example, a silicon wafer support, and removing the membrane material from the support can give a membrane. Examples of membrane materials include, but are not limited to metals, metal oxides, metal nitrides, metal carbides, and semiconductor materials.

The term "reactive material" in the context of the present disclosure is used to describe a material that comprises a substance capable of etching another material under a given set of conditions. In particular, a reactive material, when exposed to an amount of energy, can release a substance capable of etching the other material, in particular, capable of etching a membrane. The amount of energy to release the substance capable of performing the etching can be approximated by the bond energy (i.e. bond strength), in some examples between a metal and a halogen, of a particular reactive material. The bond energy of an electron beam is typically more than enough to break metal halogen bonds. The lower the bond energy between the metal and the halogen, the faster pore formation process can be. The higher the bond energy between the metal and the halogen, the slower the pore formation process can be. Furthermore, the bond strength can be a function of a stoichiometry of the reactive materials with respect to the membrane material.

The term "reactive material precursor" as used herein is defined to mean a material that is capable of being converted to a reactive material by exposing the reactive material precursor to a reagent capable of performing said conversion. For example, the reactive material precursor can be deposited on a membrane and the membrane comprising the reactive material precursor can be exposed to a reagent to convert the reactive material precursor to a reactive material.

The term "exposed" as used herein is defined to mean a process for contacting a membrane comprising a reactive material precursor with a reagent capable of converting the reactive material precursor to a reactive material.

The term "irradiation" as used herein is defined to mean a process by which a material is exposed to radiation. The term "radiation" can be used to describe any process by which energy waves and/or particles travel through space. In particular, radiation according to the present disclosure comprises radiation in the form of an electron beam and can range in energy from approximately 1-300 keV.

A membrane comprising a reactive material according to the present disclosure can be volatilized and/or eroded with less energy than the membrane alone. Thus, a reactive material can be incorporated into a membrane to reduce an amount of energy for forming a pore in the membrane.

In the case where the membrane comprises a reactive material, once the beam is focused, a pore can form in less than a few milliseconds while in a non-reactive material method this can take up to a few minutes.

In an exemplary method, a membrane comprising a reactive material can be exposed to an electron beam. An electron beam of a given energy can start by irradiating the membrane over a particular radius followed by a narrowing of the beam to a smaller radius of an area of interest on the membrane, where the area of interest is the area over which a pore is desired. Narrowing of the electron beam can lead to a higher energy exposure on the area of the membrane onto which the beam is focused.

Once the electron beam is focused at peak intensity, electron ablation of the membrane to form a pore without a reactive material can take approximately 30 seconds to a few minutes. A focused electron beam at peak intensity on a membrane comprising a reactive material can take approximately a few milliseconds. A faster time for pore formation can lead to an increase in throughput, uniformity of pores and/or patterns, and higher periodicity of pores and/or patterns.

A reactive material can provide two mechanisms to speed up an electron ablation process. First, in conjunction with energy provided by the electron beam, the reactive material can convert some of the membrane material into a new chemical species. If the conversion into the other chemical species involves less energy than an energy required to thermally break inter-atomic bonds initially present in the membrane, then an amount of time involved for pore formation can be reduced.

Furthermore, if the new chemical species is volatile at lower temperature than a starting membrane material, then the exposed membrane can volatilize with less energy input than a higher boiling starting membrane material. Consequently, heating of an area around liberated atoms can be reduced and thus the process of creating pores in an exposed membrane can be sped up and be done at lower electron beam currents/voltages.

For example, if a membrane comprising silicon and/or silicon species is used, a solid state fluorine source can be used as a reactive material for the silicon containing membrane. The electron beam that irradiates the membrane can provide enough energy to convert portions on the surface of a silicon membrane into $SiF_x$ (x=1-4) by reaction with the solid state fluorine source. Because silicon-halide gases are relatively stable, the transition from Si to $SiF_x$ involves less energy than an amount of energy to break all the silicon bonds initially present in the membrane, thus lowering an amount of time to volatilize a silicon atom and/or silicon species within the membrane.

The term "stable species" as used herein refers to a species which is not volatile at room temperature, in particular, a species having a partial pressure of less than approximately 100 mTorr at room temperature.

Furthermore, $SiF_x$ (x=1-4) gases are more volatile at lower temperatures than silicon itself. For example, $SiF_4$ is volatile at room temperature and thus lower energy from the beam is needed for volatilization of $SiF_4$ compared to Si and/or Si species, which can lead to faster pore formation time and/or lower beam currents and/or voltages.

In some embodiments, the membrane comprises a compound of formula 1, where A can comprise a metal, metalloid, and/or semiconductor element and L can comprise a main group element. Exemplary main group elements according to the present disclosure include but are not limited to O, N, C. In particular, A can comprise Al, Au, a group IIIa, IVa, or Va element; a refractory metal such as Ti, V, Cr, Zr, Nb, Mo, Ru, Rh, Hf, Ta, W, Re, Os, and Ir; or a semiconductor element. A membrane can also comprise a group IIIa/Va semiconductor, including but not limited to GaAs, InAs, and GaP.

$$(A)_x(L)_y \qquad\qquad 1$$

The values of x and y in (1) can vary and depend on the oxidation state of A and the identity and charge of L and in some embodiments y=0. The membrane can comprise a specific chemical formula according to (1) or can be an amorphous solid comprising A and L or any mixture thereof.

The membrane can comprise a single type of compound according to formula (1) or more than one type of compound according to formula (1).

In some embodiments, the membrane comprises a silicon and/or tungsten species according to formulas (2) and (3) and can comprise more than one of each species. The membrane can comprise a specific chemical formula according to (2) or (3) or can be an amorphous solid comprising Si and L or W and L or any mixtures thereof and in some embodiments y=0.

$$(Si)_x(L)_y \qquad\qquad 2$$

$$(W)_x(L)_y \qquad\qquad 3$$

The tungsten species can comprise tungsten in any one or more of the following oxidation states: 0, +2, +3, +4, +5, and +6; the silicon species can comprise silicon in any one or more of the following oxidation states: 0, +2, +4, and +6; and L can be any main group element or polyatomic species. The values of x and y can vary and depend on the oxidation state of Si and/or W as well at the identity and charge of L.

The membrane can comprise a single type of silicon species or more than one type of silicon species. For example, the membrane can comprise both $SiO_2$ and SiC or only SiC.

The membrane can comprise a single type of tungsten species or more than one type of tungsten species. For example, the membrane can comprise both $WO_3$ and WC or only WC.

In a case where W or Si is in a 0 oxidation state, there can be one or more ligands L as in formulas (2) and (3) or there can be no ligand L, i.e. elemental W or Si.

In some embodiments, L=C, N, or O. Exemplary membranes can thus comprise silicon dioxide (4), silicon nitride (5), silicon carbide (6), tungsten (VI) oxide (7), tungsten nitride (8), and tungsten carbide (9) and any mixtures thereof. The membrane can comprise a specific chemical formula according to (4-9) or can be an amorphous solid comprising Si and O, N, or C; or W and O, N, or C, or any mixtures thereof. The membranes can further comprise a doping material.

| $SiO_2$ | $Si_3N_4$ | SiC | $WO_3$ | $WN_2$ | WC |
|---|---|---|---|---|---|
| 4 | 5 | 6 | 7 | 8 | 9 |

In some embodiments, an exposure reagent for converting a reactive material precursor into a reactive material is a halogenating reagent. The halogenating reagent can include, but is not limited to, an elemental halogen reagent or a noble gas dihalogen reagent according to formulas (10) and (11), respectively:

$(NG)X_2$  (10)

$X_2$  (11)

In some embodiments, the noble gas is xenon and the halogen is fluorine (i.e. $XeF_2$).

The halogen can be selected from the group consisting of F, Cl, Br, and I. Other halogenating reagents that can be used include, but are not limited to $CF_4$, $CHF_3$, $F_2$, $Cl_2$, $I_2$, HBr, HI, $SiCl_4$, $XeF_2$, $BCl_3$, $SF_6$, $C_4F_8$, and $ClF_3$.

A reagent used to form a reactive material can comprise any chemical species that can be used to etch a membrane.

$(A)_x(L)_y$, a membrane material according to formula (1) can undergo direct volatilization and/or decomposition by providing an energy $E_1$ by an electron beam to give decomposition and/or volatilization without utilizing a reactive material. According the embodiments of the present disclosure, $(A)_x(L)_y$ can be converted into $(A)_x(X)_z$ by incorporating a reactive material into the membrane, the reactive material capable of releasing an etching species, the etching species capable of converting $(A)_x(L)_y$ into $(A)_x(X)_z$ by providing an energy $E_2$, for example, by an electron beam. $(A)_x(X)_z$ can volatilize and/or decompose into species that can volatilize upon irradiation by an electron beam by further providing an energy $E_2'$. If $E_2+E_2'$ is less than $E_1$ as seen in Scheme 1, then a pore and/or pattern formation can be faster by utilizing the $E_2/E_2'$ pathway in comparison to direct electron ablation by the $E_1$ pathway.

Scheme 1. Comparison of energy pathways of decomposition and/or volatilization of $(A)_x(L)_y$.

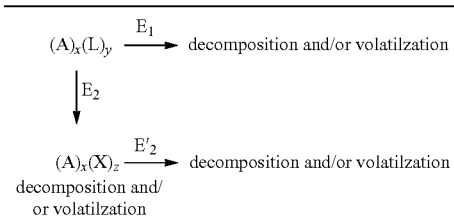

FIG. 1 shows an exemplary pore forming process within a membrane as observed within an electron microscope. A sequence showing how a focused electron beam's intensity is narrowed can be seen moving from top to bottom of FIG. 1. The electron beam is narrowed until it reaches a cross-over, at which point the beam begins to widen. FIG. 1 shows a formation of 5 nm pore through a 150 nm $SiO_2$ layer.

The cross-over is a point at which the beam is the most focused and thus the most intense over a focused radius. A lens within an electron microscope can be used to focus the beam in this manner. The profile of the beam in this process shown in FIG. 1 can be described as two cones sitting on top of each other point to point. When the beam reaches the point where the two cones meet, the beam is at is most intense and most focused point and this is when a pore can be formed.

Figure 4:
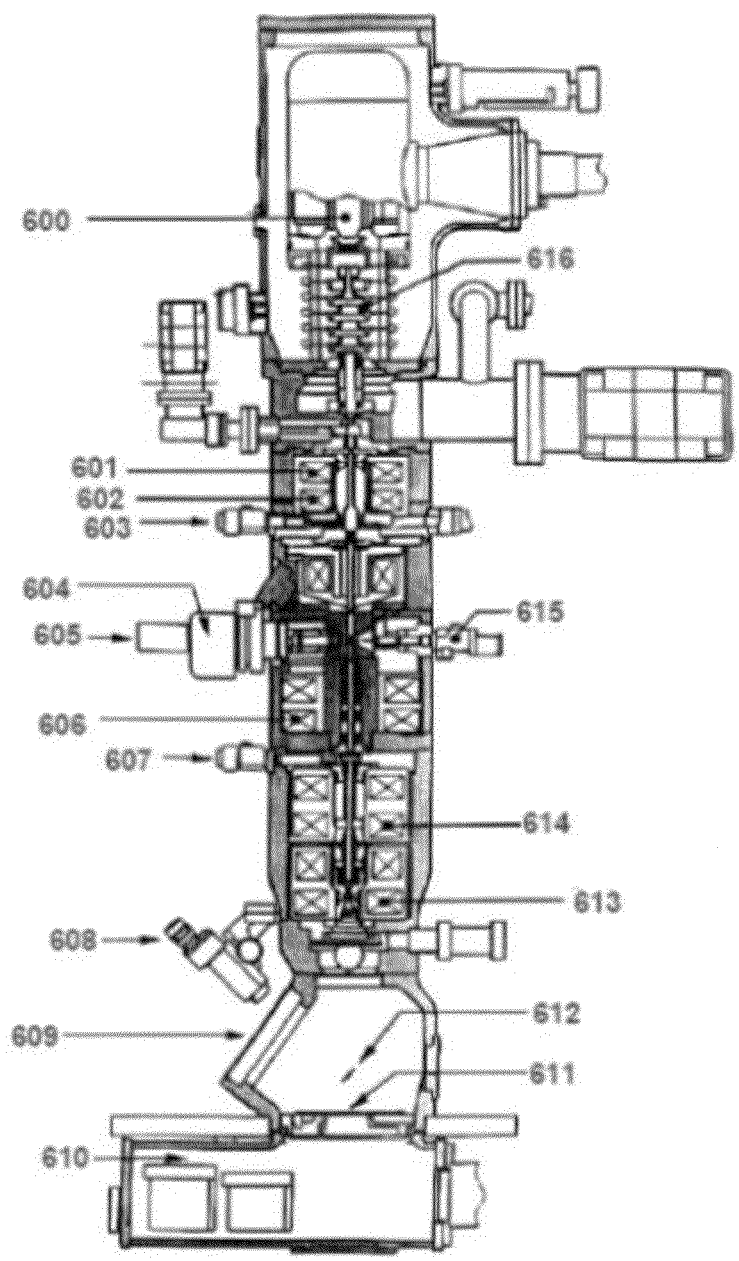
FIG. 4 shows a schematic of an exemplary transmission electron microscope (TEM) than can be used to form a pore in a membrane.

FIG. 4 shows a schematic of an exemplary transmission electron microscope (TEM) than can be used to form a pore in a membrane. A TEM can comprise an electron gun (600), an acceleration tube (616), a binocular (608), a viewing port (609), various lenses (e.g. a $1^{st}$ condenser lens (601), a second condenser lens (602), and an objective lens (606), a projector lens (613), and an intermediate lens (614)), a condenser aperture assembly (603), a selected field aperture (607), an objective aperture (615), a specimen holder (605), a goniometer (604), a camera chamber (610), and a large (611) and small (612) fluorescent screen. The lenses in the TEM can be used to control the focus of an electron beam onto a membrane.

Figure 5:
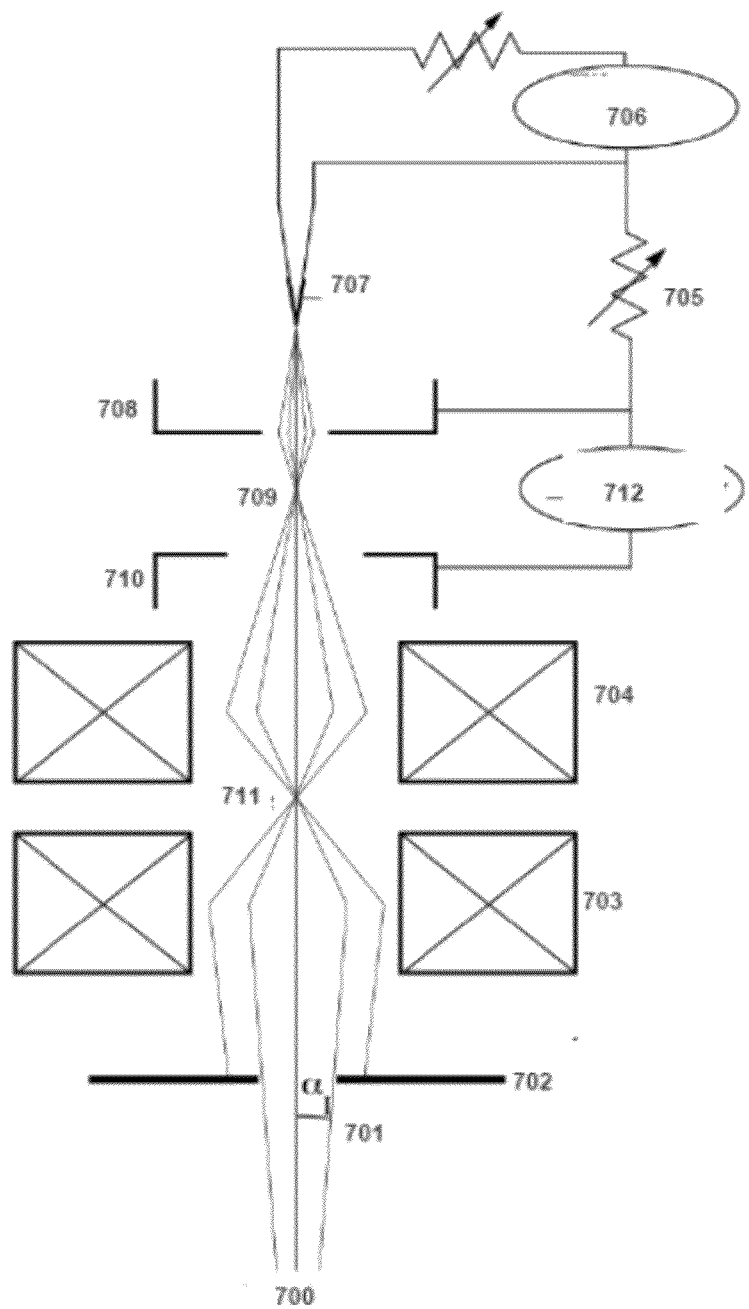
FIG. 5 shows a schematic of how a beam can be focused in a transmission electron microscope (TEM) in order to control intensity and radius of a beam.

FIG. 5 shows a schematic of how a beam can be focused in a transmission electron microscope (TEM) in order to control intensity and radius of a beam. In an exemplary TEM electrons are extracted from a filament and accelerated downward by a bias voltage of approximately 200 keV. The lenses can be made of coils of wire which pass large amounts of currents in the shape of a solenoid that wrap around the path of the beam creating a magnetic field. This magnetic field can be used to focus the electrons into a beam. The beam is further collimated with a physical aperture to ensure that the electrons that impinge on the sample are all traveling parallel to each other. FIG. 5 shows two condenser lenses (703 and 704), a condenser aperture (702), a filament (707) and filament current (706), a bias/emission (705), an anode (710), and a Wehnelt Cap (708) of an exemplary TEM. FIG. 5 further shows where a crossover image occurs (709), where a demagnified crossover image occurs (711), an illumination angle (701), and where a specimen is placed (700).

In some embodiments, a method for defining a nanometer-size pore through a membrane can comprise the following steps. A membrane material can be selected based on a desired use of the membrane and/or its compatibility with a pore formation by electron beam ablation. For example, a silicon oxide- or silicon nitride-type membrane can be used for DNA sequencing or as a biological filter. The compatibility with a pore formation by electron beam ablation can be based on a material's ability to be chemically. Based on the type of membrane that is selected, a reactive material precursor can be selected based on the ability of the reactive material precursor to be converted to a reactive material which is able to chemically etch the membrane upon irradiation.

For example, if silicon membrane is selected, $Al_2O_3$ can serve a reactive material precursor because it can adhere to silicon and because it can be converted to a reactive material $AlF_3$. $AlF_3$ can be considered to be a reactive material for a silicon membrane as $AlF_3$ comprises fluorine which is capable of etching the silicon membrane by forming $SiF_x$ (x=1-4).

For example, a reactive material precursor can be deposited on a membrane and the membrane can be exposed to a reagent capable of converting the reactive material precursor to a reactive material, the reactive material capable of etching the membrane under certain conditions. The conditions under which a reactive material can etch a membrane can be approximated by the binding energy of the reactive material. The membrane comprising the reactive material can then be irradiated with an electron beam to form a pore and such membrane can be volatilized and/or eroded and volatilized with less energy than the starting membrane material. Additionally, a reactive material can deposited onto a membrane directly.

A reactive material can be any material comprising a chemical species capable of etching another material under a given set of conditions. The conditions under which the species can be released can be approximated by the bond energy of the reactive material. Thus, a rate of pore formation can be controlled by selecting a reactive material based on a corresponding bond energy.

A reactive material according to the present disclosure can comprise any stable solid organic or metal halide (i.e. an organic or metal halide that does not naturally decompose at room temperature) with a bond energy of the metal and the halogen such that the halogen can be liberated upon irradiation with an electron beam to provide a halogen X, where X=F, Cl, Br, or I. For example, solid organic and metal halides can include but not limited to $AlX_n$, $W_mX_n$, $Mo_mX_n$, KX, NaX, $CX_4$, $CF_4$, $C_4F_8$, where the values of m and n depend on the oxidation state of the metal.

A reactive material thus can be selected based on a type of halide that the reactive material is comprised of, the type of halogen being selected based on its ability to etch a desired membrane material. A type of halogen that can be used to etch a particular membrane can be readily identified by one skilled in the art.

For example, most refractory metals, group IV materials, group III/V semiconductors and Au can be etched by halides F, Cl or I. When these materials are attacked by said halides they can form a stable and volatile gas, thus etching the materials.

Reactive material precursors can generally comprise any of the same materials that comprise membranes as described herein, wherein the reactive material precursors are capable of forming a stable species with at least one halide bond.

A reactive material precursor can be deposited onto a membrane using standard microfabrication methods, including, but not limited to sputtering, thermal evaporation, electron beam evaporation, pulsed laser deposition, and ion beam evaporation. Additionally, a reactive material precursor can be suspended in a solvent and spun onto a wafer.

For example, Aluminum oxide can be sputtered onto a membrane using an aluminum target in an argon and oxygen plasma. The aluminum target, which can serve as a source of aluminum in the $Al_2O_3$, can comprise a two inch diameter and ⅛ inch thick disk of 99.999% aluminum and with an a plasma comprising argon and oxygen gases with 6:2 ratio of oxygen, the aluminum can leave the aluminum target as Al and can be converted to $Al_2O_3$ within the plasma. The Ar and $O_2$ are ionized in the plasma and a field can be set up by a sputtering gun to fling the argon and oxygen ions at the aluminum target. When the ions hit the target and expel aluminum from the disk, this aluminum combines with the oxygen in the chamber and deposits onto the membrane of the chip mounted on the other side of the chamber as aluminum oxide.)

Once a reactive material precursor is selected, an exposure reagent can be selected. The exposure reagent can be selected based on its ability to convert a reactive material precursor in a reactive material. For example, if an $Al_2O_3$ reactive material precursor is used and a desired conversion is $Al_2O_3 \rightarrow AlF_3$, then a fluorinating agent such as $XeF_2$ and/or $F_2$ can be used as exposure reagents. However, other reagents capable of performing this conversion can be used, for example any reagent that reacts with the reactive material precursor to form reactive material forming a solid surface on the membrane can be used.

For example, exposure reagents can include but are not limited to $XeF_2$, $SiCl_4$ and plasma such as $SF_6$, $F_2$, $Cl_2$, HI, $BCl_3$, HCl, $BBr_3$, HBr, $CF_4$, $C_4F_8$. Therefore, if a reactive material comprising fluorine is desired, then the following exposure reagents can be used $XeF_2$, $SF_6$, $F_2$, $CF_4$, $C_4F_g$. If a reactive material comprising iodine is desired, then HI can be used. If a reactive material comprising chlorine is used, then $Cl_2$, or $BCl_3$ can be used.

Once an exposure reagent is selected, a time and/or a number of exposures to be repeated can be determined. An exposure time and a number of repeated exposures can be selected based on a degree to which conversion of a reactive material precursor to a reactive material is desired. If complete conversion is desired then longer exposure times and/or repeated exposures can be used. Complete conversion of a reactive material precursor to a reactive material can give a high concentration of reactive material and thus a faster pore formation time. Therefore, degree of conversion can be used to control, in part, the rate of pore formation. It should be considered, however, that there is a maximum amount of exposure to a reagent that should be used based on the amount of reactive material precursor that is present on the membrane to avoid premature direct etching of the a membrane by the exposure reagent.

In order to determine the degree of conversion of the reactive material precursor to a reactive material, energy dispersive X-ray spectroscopy (EDX, EDAX, or EDS) can be used. For example, a membrane comprising a deposited reactive material precursor can be exposed to an exposure reagent at a certain concentration and for an amount of time and can subsequently be analyzed by EDX to determine degree of conversion to reactive material.

EDX bombards a sample with electron beams with enough energy to excite core electron of atoms which then emit X-rays of varying energy, the varying energies being characteristic of particular elements. Thus by measuring resulting X-rays, it can be determined which elements are present. For example, if the following conversion of $Al_2O_3$ to $AlF_3$ is being monitored, a relative concentration of Al, F, and O can be determined by EDX to, in turn, to determine a degree of conversion of $Al_2O_3$ to $AlF_3$.

If there is a high degree of conversion and a lower degree of conversion is desired, then a lesser number of exposures and/or a shorter exposure time can be used. If there is a low degree of conversion and a higher degree of conversion is desired, then a greater number of exposures and/or a longer exposure time can be used.

Exposing a membrane comprising a reactive material precursor can comprise placing the membrane in a sealed vessel with a gas reagent for a period of time followed by removing the membrane from the sealed vessel. This process can be repeated for further exposure. An exposure can also comprise directly placing a membrane in a halogen plasma for a period of time followed by removing the membrane from the halogen plasma and the exposure can be repeated.

In some embodiments, a reactive material can be directly deposited onto a membrane by using a thermal evaporator in place of exposing of the membrane to a reagent.

After the membrane has been exposed to a reagent and/or has been deposited with a reactive material, the radius and intensity of the electron beam as well as an amount of time that the exposed membrane is to be irradiated by the electron beam can be used to control the radius and depth of the pore as well as an amount of time to form the pore.

Methods for selecting a reactive material for particular membrane materials to be used in electron beam ablation according to the present disclosure are now described by way of example. Given a particular membrane material, a reactive material can be selected based on a type of halide that the reactive material is comprised of, the type of halogen being selected based on its ability to etch a desired membrane material.

For example, if a Si-containing membrane material is selected, a reactive material precursor such as $Al_2O_3$ can be used. A method for converting the $Al_2O_3$ reactive material precursor into a reactive material can comprise exposing the membrane to fluorine with $XeF_2$ which can convert the reactive material precursor to $AlF_x$. Upon irradiation of the membrane with an electron beam, fluorine can be liberated from the $AlF_x$ and combine with the Si in the membrane and convert it into $SiF_x$ which can leave as a volatile gas. If the silicon containing membrane comprises $SiO_2$, the oxygen can leave as $O_2$ gas. If the silicon-containing membrane comprises silicon nitride, the nitrogen can leave as $N_2$ gas, thus requiring less energy to break all of Si—Si and Si—O bond initially present in the membrane.

As another example, if a TiN membrane material is selected, a reactive material precursor such as $Al_2O_3$ can be used. Aluminum can be used here because it can be easy to sputter and typically isn't etched by fluorine and thus can converted into reactive material $AlF_x$. Aluminum oxide is commonly used in semiconductor fabrication lines. A method for converting the $Al_2O_3$ reactive material precursor into a reactive material can comprise exposing the membrane to fluorine with $XeF_2$ which can convert the reactive material precursor to $AlF_x$. Upon irradiation of the membrane with an electron beam, fluorine can be liberated from the $AlF_x$ and combine with the Si in the $SiO_2$ and convert it into $SiF_4$ which can leave as a volatile gas and the oxygen can leave as $O_2$ gas.

As a further example, if a molybdenum oxide membrane material is selected, a reactive material precursor such tungsten oxide can be used. Tungsten can be used here because tungsten can form a stable solid with Cl at room temperature and thus can remain on the membrane as a solid layer. For example, if aluminum oxide were used, chlorine can etch the aluminum as the AlCl compound can be relatively volatile. A method for converting the tungsten oxide reactive material precursor into a reactive material can comprise exposing the membrane to a $Cl_2$ plasma which can convert the reactive material precursor into $WCl_x$. Upon irradiation of the membrane with an electron beam, chlorine can be liberated from the $WCl_x$ and convert the molybdenum in the molybdenum oxide membrane into a relatively volatile molybdenum chloride compound, having a boiling point of approximately 200C which can leave as a gas and the oxygen can leave as $O_2$ gas.

As another example, if a tungsten carbide membrane material is selected, a reactive material precursor such a aluminum oxide can be used. A method for converting the aluminum oxide reactive material precursor into a reactive material can comprise exposing the membrane to an $XeF_2$ exposure reagent which can convert the reactive material precursor into $AlF_x$. Upon irradiation of the membrane with an electron beam, chlorine can be liberated from the $AlF_x$ and convert the tungsten in the tungsten carbide membrane into a volatile tungsten fluoride compound which can leave as a gas and the carbon can leave as $CF_4$ or $CO_2$ from leftover $O_2$ in the aluminum oxide.

As another example, if an aluminum membrane is selected, a NaCl solution can be spin coated onto the aluminum membrane and dried to give a solid layer comprising NaCl which can serve as the reactive material. The chlorine can be liberated from the NaCl with the electron beam and used to reactively etch the aluminum in conjunction with the electron beam. The remaining salt can be removed with water.

Figure 2:
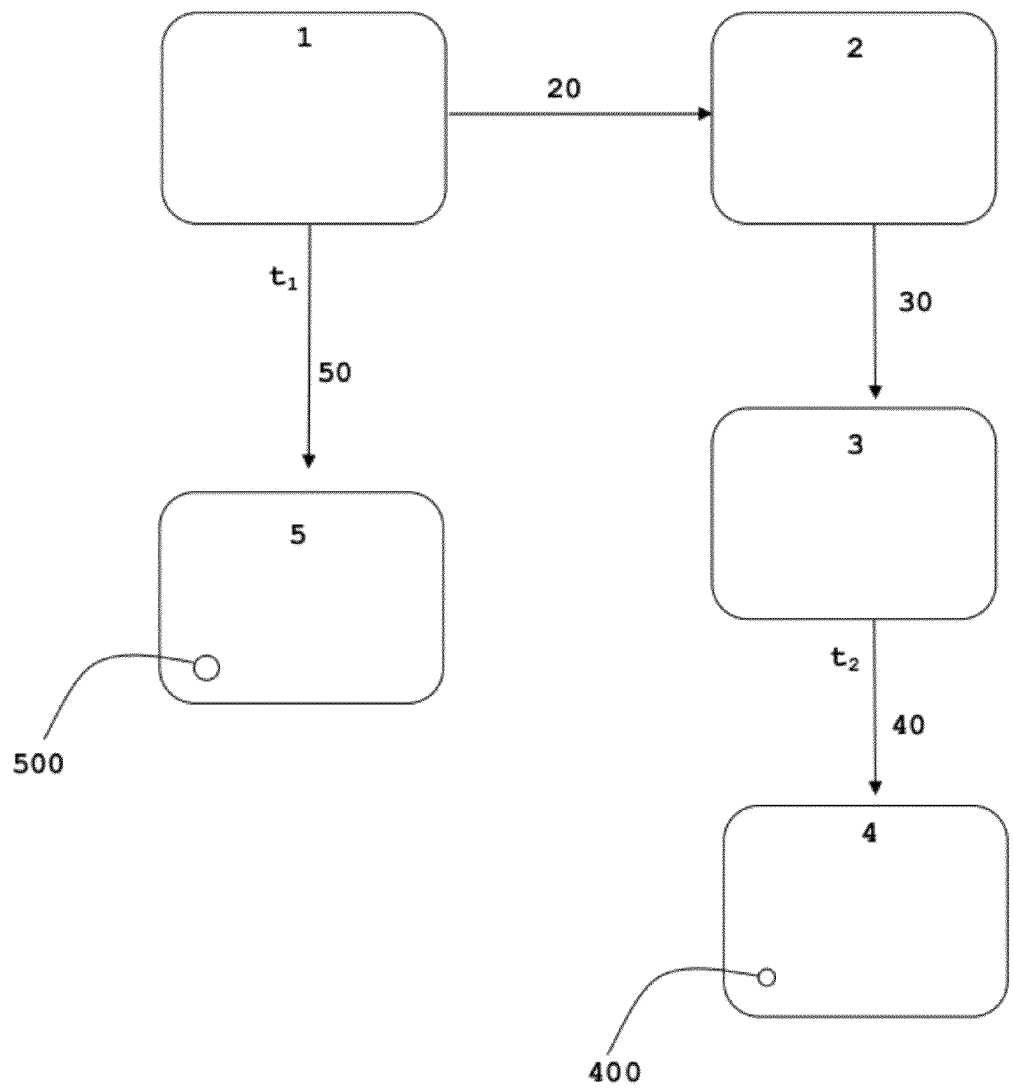
FIG. 2 shows a schematic of a method of pore formation in a membrane according to embodiments herein described.

With reference to FIG. 2, in some embodiments of the present disclosure, a reactive material precursor, which comprises any material capable of being converted to a reactive material, can be deposited (20) on membrane (1) to give membrane (2). Membrane (2) can then be exposed (30) to a reagent which can convert the reactive material precursor into a reactive material to give membrane (3), a membrane comprising a reactive material. Membrane (3) can be irradiated (40) for a period of time ($t_2$) to form a pore (400) and the process can be repeated to form additional pores and/or patterns. This process can be compared to a process of directly irradiating membrane (1) for a time $t_1$ to form a pore (500) wherein, according to the present disclosure, $t_1 > t_2$.

In some embodiments, the pores can be formed close together on a membrane by utilizing a membrane comprising a reactive material according to the present disclosure. For example, a 0.5 nm pore can be placed as close as approximately 2-3 nm apart. Once a beam is well-focused such short range periodicity can be obtained. This ability to achieve such short range periodicity can be due to the short amount of time in which a pore can be formed by incorporating a reactive material. Longer pore formation times can cause the membrane to heat up from exposure to the beam and can cause pores to join together to form a larger pore.

In some embodiments, the pores are formed one at a time. Given the relatively fast pore fabrication time, a large number of pores can be formed in a short time. For example, approximately 100,000 pores per second.

In some embodiments, beam control software can be used to drag the beam around on the membrane and create patterns more complex than pores. For example, a pattern can be drawn using a computer program such as CAD or AutoCAD software. The program can load the pattern and guide a beam using conditions in a pattern file, thus irradiating the areas indicated in the file and forming the pattern in the membrane. Therefore, a complex pattern can be cut into the membrane using beam control software. Forming complex patterns can be used, for example, in creating biological conduits. Certain biological molecules have distinct shapes, but cutting holes in specific patterns such molecules can be trapped or filtered using these nanometer scale pores.

In some embodiments, the beam is controlled by hand. Thus a user can manually drag around the electron beam to create pattern.

In some embodiments a fixed voltage of approximately 200 KV is used. However, by changing a beam current (i.e. the number of electrons in the beam), a rate of pore formation can be controlled. For example, the higher the beam current the faster a pore can be formed and the lower the beam current, the slower a pore can be formed. While a higher current can be used to form a pore faster, a desired pore radius can also be considered in connection with beam current. For example, it can take longer to form a pore at a lower beam current but a smaller pore can be made with a lower beam current. A lower beam current can lead to a more narrow focused radius of the beam compared to a higher current beam due to a minimizing of electron repulsions since there are less electrons present in a lower current beam. A beam current can be adjusted between approximately 1-1,000 picoamperes (pA).

While an electron beam with a wider radius can be used to form a wider radius pore and a narrower electron beam can be used to form a smaller radius pore, a longer focus time can also give a wider radius pore due to a Gaussian distribution of electron from the beam.

Figure 6:
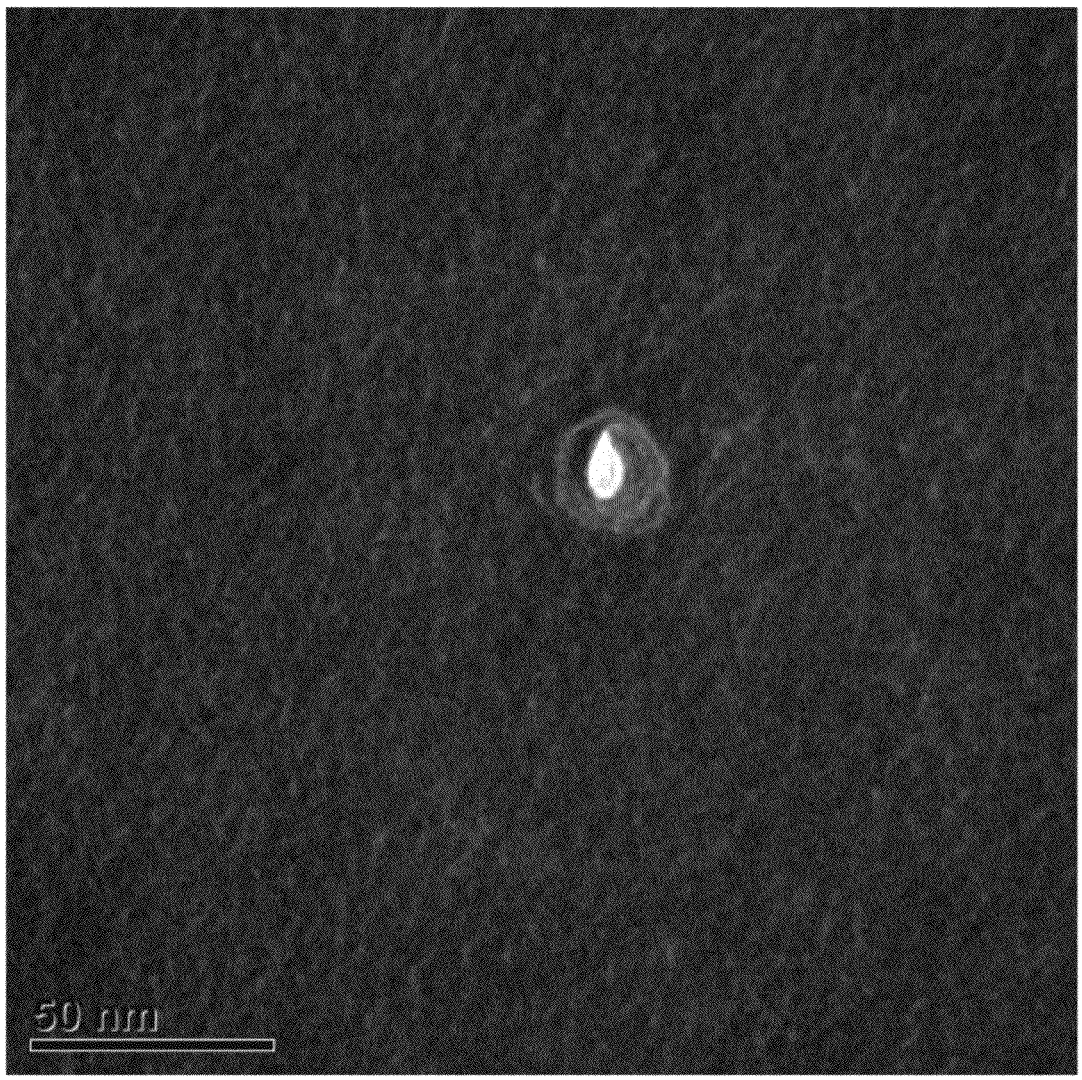
FIG. 6 shows a pore formed by methods according to the present disclosure.
Figure 7:
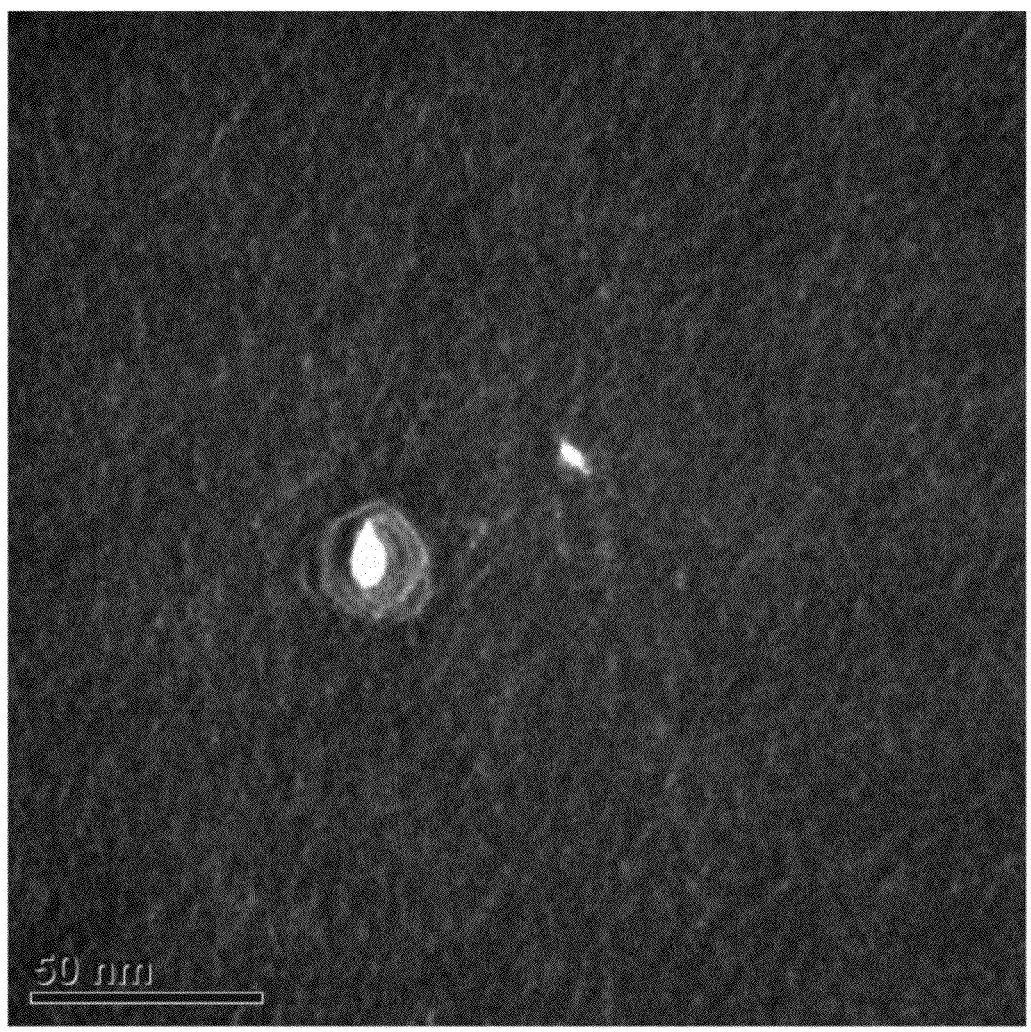
FIG. 7 shows two pores formed by methods according to the present disclosure in which the pore in the upper right of the figure was formed with approximately half the electron beam ablation time as the pore in the lower left of the figure.

For example, FIG. 6 shows a first pore formed by methods according to the present disclosure and FIG. 7 shows the first pore as shown in FIG. 6 (in the lower left of FIG. 7) along with a second pore (in the upper right of FIG. 7) which was formed with approximately half the electron beam ablation time as the first pore shown and accordingly leads to a smaller pore.

With respect to time for pore formation, a higher intensity (i.e. higher energy) radiation can form a pore in less time than a lower intensity (i.e. lower energy) radiation. Likewise, given a particular radiation intensity, longer irradiation times can be used in place of a higher radiation intensity and shorter irradiation times can be used in place of a lower radiation intensity.

To control pore depth, an amount of time for irradiation the exposed membrane and/or intensity of the radiation can be increased if a deeper pore is desired while an amount of time for irradiation of the exposed membrane and/or the intensity of the radiation can be decreased if a shallower pore is desired.

Depth and width are linked in terms of what can be achieved given a certain set of conditions for electron beam ablation, with or without a reactive material. Aspect ratios (depth/width) than can be obtained with the disclosed method can be as high as approximately 100. For example, a 2 nm hole can be formed in a 150 nm thick $SiO_2$ membrane.

More complex patterns can be formed in a membrane comprising a reactive material by irradiating the membrane comprising the reactive material by dragging an electron beam along a surface of the membrane to form the complex pattern. Such patterns can be programmed into computer software such as CAD or AutoCAD to control a path of the beam or the beam can be controlled by hand.

Figure 3:
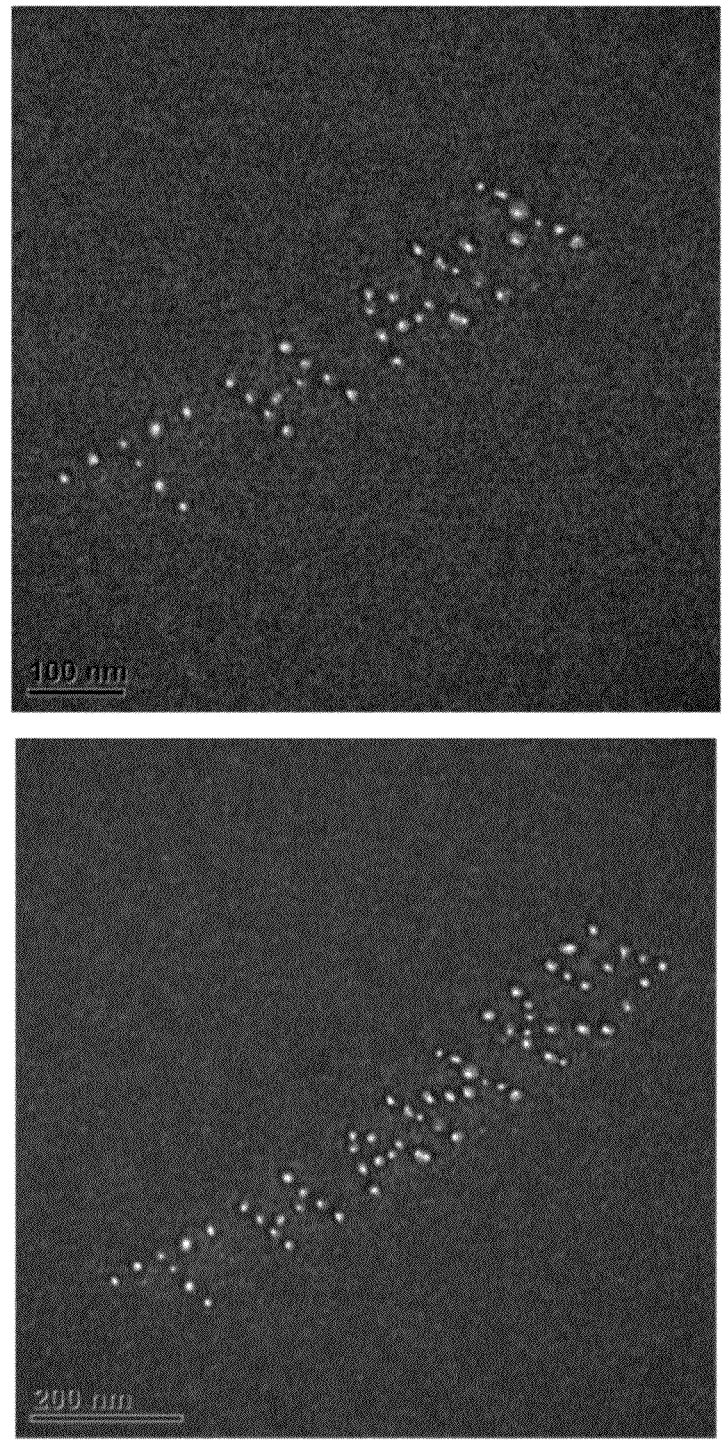
FIG. 3 shows an example of a membrane in which a more complex pattern was formed by electron beam ablation of the membrane comprising a reactive material, the complex pattern being a writing of the word "THANKS".

For example, FIG. 3 shows an example of a membrane in which a more complex pattern was formed. FIG. 3 shows a writing of the word "THANKS" in the middle of writing (top of FIG. 3) and when the writing is finished (bottom of FIG. 3).

In one embodiment, incorporation of more than one reactive material onto a membrane can comprise depositing more than one reactive material precursor onto a membrane followed by exposing the membrane to a single exposure reagent capable of reacting with all of the reactive material precursors or followed by separately exposing the membrane to more than one exposure reagent.

In another embodiment, if more than one reactive material is desired, each of the reactive materials can be directly deposited onto the membrane.

Using more than one reactive material can also be used to obtain an intermediate reactivity between two or more reactive materials. For example if a first reactive material achieves pore formation very quickly and a second reactive material achieves pore formation more slowly, a mixture of these two reactive materials can be used to control a rate of pore formation with the upper limit of a rate of pore formation of the first reactive material and the lower limit of a rate of pore formation of the second reactive material depending on relative and absolute concentration of each reactive material on the membrane.

In some embodiments, more than one reactive material can be used. For example, if a membrane comprises more than one species, wherein the species are more suitably etched by different reactive materials, then two different reactive material can be incorporated, one to suit each species. For example, Si, which can be used as membrane material, is often doped with another element such as aluminum to provide silicon with conductive properties. If a high concentration of dopant is used, then a single reactive material may not be effective for etching both species present in the membrane. In the Al-doped Si example, Al is etched well with Cl and Si is etched well with F. Therefore, in this case, a reactive material comprising fluorine and another reactive material comprising chlorine can be used together on the same membrane.

EXAMPLES

The methods for defining nanometer-sized pores on membranes comprising reactive materials of the present disclosure are further illustrated in the following examples, which are provided by way of illustration and are not intended to be limiting.

A person skilled in the art will appreciate the applicability and the necessary modifications to adapt the features described in detail in the present section, to additional methods and systems according to embodiments of the present disclosure.

Example 1

A Method for Exposing a Membrane to a Reagent to Form a Membrane Comprising a Reactive Material A membrane comprising a deposited reactive material precursor is placed in a vacuum chamber and the air is pumped out to roughly a pressure of 1 mTorr. An exposure reagent is allowed to sublime in a separate chamber, and a valve is opened to allow this gas to diffuse into the chamber until the chamber reaches a specific pressure. The pressure can be selected based on a desired concentration of the gaseous exposure reagent. The valve is closed and the pressure is maintained for a given time, approximately 10 seconds, followed by pumping away the gas from the chamber. The process can be repeated between 5-25 times and can be tested by EDX for conversion to a reactive material after any given exposure, to give a membrane comprising a reactive material on an outer layer.

Example 2

A Method for Exposing an Aluminum Oxide Membrane to a Reagent to Form a Membrane comprising Aluminum Fluoride, a Reactive Material An $Al_2O_3$ membrane is placed in a vacuum chamber and the air is pumped out to roughly a pressure of 1 mTorr. $XeF_2$ crystals are allowed to sublime in a separate chamber, and a valve is opened to allow this gas to diffuse into the chamber until the pressure reaches a specific pressure (e.g., 2000 mTorr), the valve is closed and the pressure is maintained for a given time (e.g., 10 seconds), then the gas is pumped away from the chamber. The process can be repeated between 5-25 times. This allows us to turn the aluminum oxide layer on top of the membrane into an aluminum fluoride, the aluminum fluoride serving as the reactive material.

Example 3

A Method for Depositing a Reactive Material Directly onto a Membrane

A membrane and a thermal evaporator are placed inside of a high vacuum chamber and the chamber is sealed. The pressure inside the chamber is reduced by a high vacuum pump. The pressure to which the chamber is brought to and the temperature at which the thermal evaporator is set is selected based on the boiling point and/or sublimation point the solid reactive material to be deposited, increasing temperature and decreasing pressure facilitating boiling and/or subliming of the solid reactive material. Boiling and/or sublimation of the solid reactive material converts the reactive material into a gaseous state, which upon cooling can lead to deposition of the reactive material onto the membrane.

Example 4

A Membrane with 0.5 nm Pores approximately 2-3 nm Apart

Silicon wafer is thermally oxidized at 1000° C. to form a 50 nm thick $SiO_2$ membrane on top. A hole is cut through the silicon wafer from the backside to the membrane on top. Aluminum oxide is sputtered onto the top of the membrane using an aluminum target and a 400 W plasma containing a 1:5 ratio of $Ar:O_2$. The aluminum oxide is exposed to fluorine by placing the chip in a vacuum chamber into which $XeF_2$ crystals are allowed to sublime and reach a pressure of 1500 mTorr. The $XeF_2$ is evacuated after 20 seconds and the crystals are allowed to sublime once again for a total of three etching pulses. The sample is placed in the TEM and a beam is focused onto the membrane. The beam collimation is modulated to the 'cross-over' point and past it to rapidly drill the hole trough the silicon dioxide membrane. Holes can be manually placed by an operator or can be distributed using a CAD program that can automatically create an array of holes. In this case the fluorine binds to the silicon creating $SiF_4$ allowing it to etch much faster than with simple electron ablation. (The O in the $SiO_2$ leaves as $O_2$ gas)

Example 5

A Possible Method for Pore Formation in a Membrane by using More than One Etching Species A silicon wafer can have a 35 nm layer of gold evaporated onto the surface using a thermal evaporator. The sample can then be annealed at 500 C driving the gold into the silicon creating a ~50 nm thick layer of an Si/Au alloy. A hole can be cut from the backside of the wafer to the front stopping on the membrane. Aluminum oxide can then be sputtered onto the top of the membrane using an aluminum target and a 400 W plasma containing a 1:5 ratio of $Ar:O_2$. The aluminum oxide can be exposed to fluorine by placing the chip in a vacuum chamber into which $XeF_2$ crystals are allowed to sublime and reach a pressure of 1500 mTorr. The $XeF_2$ is evacuated after 20 seconds and the crystals allowed to sublime once again for a total of three etching pulses. Subsequently the sample can be exposed to a 200 W plasma of HI for approximately 60 seconds. In the end the reactive material can consist of an alloy of $AlF_xI_y$, where fluorine and iodine are both the reactive halogens to be used in the etching. The sample can be placed in the TEM and a beam focused onto the membrane. The beam collimation can be modulated to the 'cross-over' point and past it to rapidly drill the hole trough the silicon dioxide membrane. Holes can be manually placed by an operator or can be distributed using a CAD program that can automatically create an array of holes. In this case the Si is converted to $SiF_4$ due to the electron beam and the fluorine atoms in the reactive material and the Au becomes AuI which is rapidly evaporated by the heat of the electron beam. (AuI has a melting point of approximately 125 C).

Example 6

A 2 nm Hole Formed in a 150 nm to 200 nm Thick $SiO_2$ Membrane

A silicon wafer is thermally oxidized at 1000° C. to form a 200 nm thick $SiO_2$ membrane on top. A hole is cut through the silicon wafer from the backside to the membrane on top. Aluminum oxide is sputtered onto the top of the membrane using an aluminum target and a 400 W plasma containing a 1:5 ratio of $Ar:O_2$. The aluminum oxide is exposed to fluorine by placing the chip in a vacuum chamber into which $XeF_2$ crystals are allowed to sublime and reach a pressure of 1500 mTorr. The $XeF_2$ is evacuated after 20 seconds and the crystals are allowed to sublime once again for a total of three etching pulses. The sample is placed in the TEM and a beam is focused onto the membrane. The beam collimation is modulated to the 'cross-over' point and past it to rapidly drill the hole trough the silicon dioxide membrane. Holes were manually placed by an operator. In this case the fluorine binds to the silicon creating $SiF_4$ allowing it to etch much faster than with simple electron ablation. (The O in the $SiO_2$ leaves as $O_2$ gas)

Example 7

Formation of a More Complex Pattern as Shown in FIG. 3 with 5-10 nm Pores

FIG. 3 shows and example of a membrane in which a more complex pattern was formed. FIG. 3 shows a writing of the word "THANKS" in the middle of writing and when the writing is finished. The holes formed in this example are approximately 5-10 nm in diameter and are holes are cut into a 150 nm thick $SiO_2$ membrane using aluminum oxide which was converted to aluminum fluoride as a reactive material. The pattern was written with a 200 keV electron beam with ~10 pA beam current and each hole was drilled in 1/10 of a second. Further details are as follows:

A silicon wafer is thermally oxidized at 1000° C. to form a 150 nm thick $SiO_2$ membrane on top. A hole is cut through the silicon wafer from the backside to the membrane on top. Aluminum oxide is sputtered onto the top of the membrane using an aluminum target and a 400 W plasma containing a 1:5 ratio of $Ar:O_2$. The aluminum oxide is exposed to fluorine by placing the chip in a vacuum chamber into which $XeF_2$ crystals are allowed to sublime and reach a pressure of 1500 mTorr. The $XeF_2$ is evacuated after 20 seconds and the crystals are allowed to sublime once again for a total of ten etching pulses, however, less pulses can be used. The sample is placed in the TEM and a beam is focused onto the membrane. The beam collimation is modulated to the 'cross-over' point and past it to rapidly drill the hole trough the silicon dioxide membrane. Holes can be manually placed by an operator or can be distributed using a CAD program that can automatically create an array of holes. In this case the fluorine binds to the silicon creating $SiF_4$ allowing it to etch much faster than with simple electron ablation. (The O in the $SiO_2$ leaves as $O_2$ gas).

Example 8

A Possible Application for Pore Formation in a Diamond Membrane

Diamond can be grown on a silicon wafer in a Chemical Vapor Deposition (CVD) system. A hole can be cut through the silicon wafer from the backside to the membrane on top. Silicon dioxide can be deposited onto the top of the membrane using a Plasma Enhanced Chemical Vapor Deposition system using a 25W plasma with a gas mixture of silane ($SiH_4$) and nitrous oxide $N_2O$. In this case the oxygen in the $SiO_2$ is the etching species so no procedure is needed to convert the membrane coating from passive to reactive. The sample can be placed in a TEM and a beam focused onto the membrane. The beam collimation can be modulated to the 'cross-over' point and past it to rapidly drill the hole trough the diamond membrane. Holes can be manually placed by an operator or can be distributed using a CAD program that can automatically create an array of holes. In this case the liberated oxygen binds to the carbon in diamond creating CO or $CO_2$ allowing it to etch much faster than with simple electron ablation and leave as a gaseous byproduct of the etching process.

The examples set forth above are provided to give those of ordinary skill in the art a complete disclosure and description of how to make and use the embodiments of the defining nanometer-sized pores by electron microscopy of the disclosure, and are not intended to limit the scope of what the inventors regard as their disclosure. Modifications of the above-described modes for carrying out the disclosure can be used by persons of skill in the art, and are intended to be within the scope of the following claims.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

LIST OF REFERENCES

1. Storm, A. J; Chem, J. H.; Ling, X. S.; Zandbergen, H. W.; Dekker, C. *Nature Materials*, vol. 2, 2003, p 537-540.

What is claimed is:

1. A method for forming a nanometer-sized pattern in a membrane, the method comprising:
providing a membrane,
depositing a reactive material on the membrane, the reactive material being in a solid state and comprising a substance releasable from the deposited reactive material and capable of etching the membrane under a certain set of conditions, and
irradiating the membrane comprising the reactive material over a certain area and for a certain period of time with an electron beam to provide a nanometer-sized pattern in the membrane.

2. The method according to claim 1 wherein the electron beam is controlled by beam control software.

3. The method according to claim 1 wherein the electron beam is controlled by a user, by hand.

4. The method according to claim 1, wherein the pattern is formed with a maximum depth which is less than the depth of the membrane.

5. The method according to claim 1, wherein the pattern is a pore.

6. The method according to claim 1, wherein the membrane comprises silicon and/or a silicon species having a chemical formula $(Si)_x(L)_y$ wherein:
silicon is in any one or more of the following oxidation states: 0, +2, +4, and +6, x and y are numbers indicating a stoichiometry for the formula, and L is any main group element or polyatomic species; and
the membrane comprising a specific chemical formula $(Si)_x(L)_y$, is an amorphous solid comprising Si and L, or is a mixture thereof.

7. The method according to claim 1, wherein the membrane comprises tungsten and/or a tungsten containing species having a chemical formula $(W)_x(L)_y$ wherein:
tungsten is in any one or more of the following oxidation states: 0, +2, +3, +4, +5, and +6, x and y are numbers indicating a stoichiometry for the formula, and L is any main group element or polyatomic species; and
the membrane comprising a specific chemical formula $(W)_x(L)_y$, is an amorphous solid comprising W and L, or is a mixture thereof.

8. The method according to claim 1, wherein the membrane comprises at least one of a metal, metalloid, metal oxide, metal nitride, metal carbide, and/or a semiconductor material.

9. The method according to claim 1, wherein the membrane comprises a species selected from the group consisting of a group Ma element, a group IVa element, a group Va element, Ti, V, Cr, Zr, Nb, Mo, Ru, Rh, Hf, Ta, W, Re, Os, Ir, GaAs, InAs, and GaP.

10. The method according to claim 1, wherein the depositing of the reactive material comprises directly depositing the reactive material onto the membrane.

11. The method according to claim 1, wherein the depositing of the reactive material comprises depositing a reactive material precursor onto the membrane and exposing the membrane comprising the reactive material precursor to a reagent capable of converting the reactive material precursor into the reactive material.

12. The method according to claim 11, wherein the reagent capable of converting the reactive material precursor into the reactive material is a halogenating reagent.

13. The method according to claim 11, wherein the reagent capable of converting the reactive material precursor into the reactive material is a compound of formula $(NG)X_2$ where NG is a noble gas and X is a halogen.

14. The method according to claim 11, wherein the reagent capable of converting the reactive material precursor into the reactive material is a compound of formula $X_2$, wherein X is a halogen.

15. The method according to claim 11, wherein the exposing is repeated between 2-25 times.

16. The method according to claim 11, wherein the exposing is performed by placing the membrane in a sealed vessel comprising a gas reagent for a period of time followed by removing the membrane from the sealed vessel.

17. The method according to claim 11, wherein the exposing is performed by directly placing a membrane in a halogen plasma for a period of time followed by removing the membrane from the halogen plasma.

18. The method according to claim 11, where the reactive precursor comprises silicon and/or a silicon species having a chemical formula $(Si)_x(L)_y$ wherein:
   silicon is in any one or more of the following oxidation states: 0, +2, +4, and +6, x and y are numbers indicating a stoichiometry for the formula, and L is any main group element or polyatomic species; and
   the membrane comprising a specific chemical formula $(Si)_x(L)_y$, is an amorphous solid comprising Si and L, or is a mixture thereof.

19. The method according to claim 11, wherein the reactive material precursor comprises tungsten and/or a tungsten containing species having a chemical formula $(W)_x(L)_y$ wherein:
   tungsten is in any one or more of the following oxidation states: 0, +2, +3, +4, +5, and +6, x and y are numbers indicating a stoichiometry for the formula, and L is any main group element or polyatomic species; and
   the membrane comprising a specific chemical formula $(W)_x(L)_y$, is an amorphous solid comprising W and L, or is a mixture thereof.

20. The method according to claim 1, where the reactive material comprises a halogen.

21. The method according to claim 1, where the reactive material comprises a species selected from the group consisting of $AlX_n$, $W_mX_n$, $Mo_mX_n$, KX, NaX, $CX_4$, $CF_4$, $C_4F_8$, wherein the values of m and n depend on the oxidation state of the metal and X is a halogen.

\* \* \* \* \*